(12) United States Patent
Hopkins

(10) Patent No.: US 7,378,897 B2
(45) Date of Patent: *May 27, 2008

(54) INPUT STAGE FOR MULTIPLEXING AND METHODS FOR USING AN INPUT STAGE FOR MULTIPLEXING

(75) Inventor: Michael Hopkins, Tracy, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/765,781

(22) Filed: Jun. 20, 2007

(65) Prior Publication Data

US 2007/0241807 A1 Oct. 18, 2007

Related U.S. Application Data

(60) Division of application No. 11/350,417, filed on Feb. 9, 2006, now Pat. No. 7,250,805, which is a continuation of application No. 10/974,389, filed on Oct. 27, 2004, now Pat. No. 7,030,679.

(60) Provisional application No. 60/591,993, filed on Jul. 29, 2004.

(51) Int. Cl.
*H03K 17/00* (2006.01)

(52) U.S. Cl. ..................... 327/407; 327/411

(58) Field of Classification Search ............... 327/407, 327/411
See application file for complete search history.

(56) References Cited

U.S. PATENT DOCUMENTS

| | | | |
|---|---|---|---|
| 4,191,856 A | 3/1980 | Nagano et al. | |
| 5,289,048 A | 2/1994 | Ishihara et al. | |
| 5,352,987 A | 10/1994 | Harvey | |
| 5,926,068 A | 7/1999 | Harr | |
| 6,072,360 A | 6/2000 | McCullough | |
| 6,489,845 B1 | 12/2002 | Maschhoff | |
| 6,707,405 B2 | 3/2004 | Kuttner | |
| 6,956,944 B1 * | 10/2005 | Koren | 379/406.01 |
| 7,030,679 B2 * | 4/2006 | Hopkins | 327/407 |

OTHER PUBLICATIONS

Video Multiplexer Delivers Lower Signal Degradation (HA5024), Application Note AN9508.1, Intersil Corp., 2 pp. (Nov. 1996).
LMH6572 Triple 2:1 High Speed Video Multiplexer, Applications DS201096, National Semiconductor Corp., 12 pp. (Aug. 2004).
Triple and Quad, 2:1 Video Multiplexer-Amplifiers with Fixed and Settable Gain, Applications 19-2758, Maxim Integrated Products, 22 pp. (Jan. 2003).

* cited by examiner

*Primary Examiner*—Kenneth B. Wells
(74) *Attorney, Agent, or Firm*—Fliesler Meyer LLP

(57) ABSTRACT

Input stages for use in multiplexing, and methods for using the same, are provided herein. An input stage includes an input terminal and an output terminal. A voltage input signal is accepted at the input terminal of the input stage. When the input stage is selected, a substantially unmodified version of the voltage input signal is presented at the output terminal of the input stage, when the input stage is selected. When the input stage is deselected, a rejection voltage signal is produced, where the rejection voltage signal is of substantially equal magnitude and opposite polarity to the corresponding voltage input signal in order to reject the voltage input signal and thereby present a substantially constant voltage at the output terminal of the input stage regardless of variations in the voltage input signal.

21 Claims, 5 Drawing Sheets

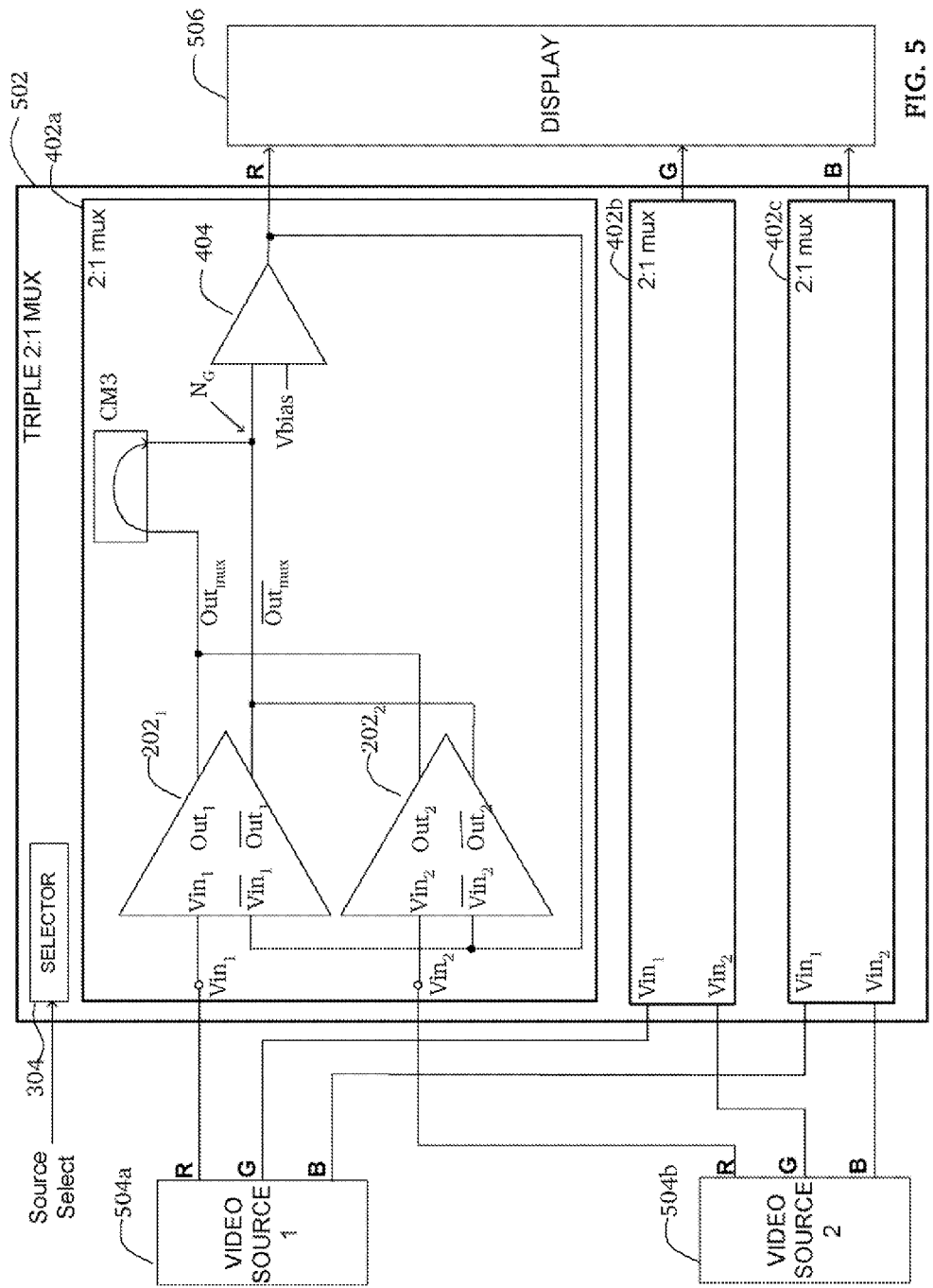

INPUT STAGE FOR MULTIPLEXING AND METHODS FOR USING AN INPUT STAGE FOR MULTIPLEXING

PRIORITY CLAIM

This application is a divisional of U.S. patent application Ser. No. 11/350,417, filed Feb. 9, 2006 (now U.S. Pat. No. 7,250,805, issued Jul. 31, 2007), which is a continuation of U.S. patent application Ser. No. 10/974,389, filed Oct. 27, 2004 (now U.S. Pat. No. 7,030,679, issued Apr. 18, 2006), which claims priority under 35 U.S.C. 119(e) to U.S. Provisional Patent Application No. 60/591,993, filed Jul. 29, 2004.

FIELD OF THE INVENTION

Embodiments of the present invention relate to the field of integrated circuits, and more specifically to analog multiplexing circuits.

BACKGROUND

The purpose of analog multiplexing circuits is to select one input from a number of analog inputs and reproduce the selected input faithfully at an output. Ideally, the multiplexer is wideband, has no feed through of unselected inputs, and can handle a reasonably wide range of input voltages from the unselected channels without causing damage to the internal circuitry of the multiplexer.

Unfortunately, high-speed semiconductor processes do not support large voltages without breakdown. Unless a schottky diode is available, the only high-speed junction available for switching function is a transistor's base-emitter (or equivalent) junction, which can be limited to as little as 1.5V of reverse bias, severely limiting the magnitude of input signals. Unfortunately, schottky diodes can not be produced using many types of semiconductor processes. Accordingly, it would be beneficial to provide an analog multiplexing circuit that can handle large input voltages and achieve high (e.g., GHz) frequency responses, without requiring a schottky diode.

SUMMARY OF THE PRESENT INVENTION

Embodiments of the present invention are directed to analog multiplexing circuits, as well as the circuits that can be used to make up analog multiplexing circuits.

In accordance with an embodiment of the present invention, a multiplexer circuit includes a plurality of switched differential amplifier circuits, one of which can be selected at a time. Each switched differential amplifier circuit includes a pair of differential inputs and a pair of differential outputs, with each pair of differential inputs accepting a corresponding pair of voltage input signals including a first input signal and a second input signal. Each switched differential amplifier circuit also includes a pair of switched input stages, each of which accepts one of the first and second input signals.

In accordance with an embodiment of the present invention, each switched input stage is configured to, when selected, present a substantially unmodified version of its input signal at its output. Additionally, each switched input stage is configured to, when deselected, produce a rejection voltage signal of substantially equal magnitude and opposite polarity to its input signal in order to reject the input signal and thereby present a substantially constant voltage at its output regardless of variations in the input signal. In accordance an embodiment of the present invention, this rejection voltage signal is produced using a transconductance circuit. More specifically, the transconductance circuit converts the input signal to a proportional current signal that, when the switched input stage is selected, flows through a passive resistance in order to produce the rejection voltage signal.

Further features, embodiments and details, and the aspects, and advantages of the present invention will become more apparent from the detailed description set forth below, the drawings and the claims.

BRIEF DESCRIPTION OF THE DRAWINGS

FIG. 5 illustrates how embodiments of the present invention can be used to produce a triple 2:1 video multiplexer.

DETAILED DESCRIPTION OF THE PREFERRED EMBODIMENT

Figure 1B:
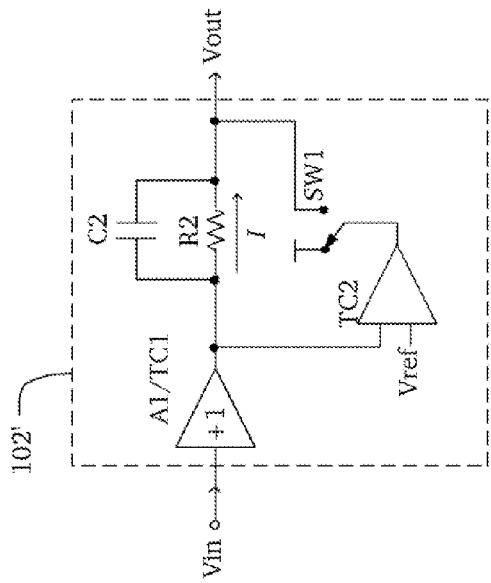
FIGS. 1A-1C are circuit diagrams of switched input stages, according to embodiments of the present invention.
Figure 1C:
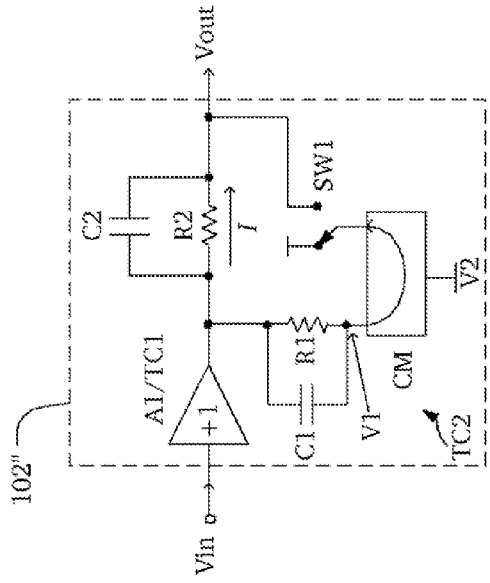
Figure 1A:
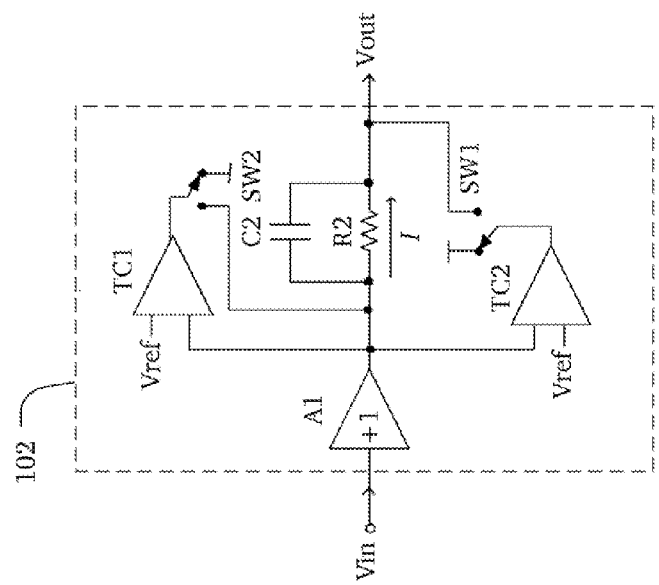

FIG. 1A is a circuit diagram of an input stage 102 according to an embodiment of the present invention. The input stage 102 is shown as including an input buffer A1, a resistor R2, a capacitor C2, a pair of transconductors TC1 and TC2, and a pair of switches SW1 and SW2. While use of the buffer A1 is customary to unload the input signal source, it is not strictly necessary, and thus need not be included. If the buffer A1 is used, an input signal Vin that is presented at an input to the buffer A1 is passed through the buffer A1, which presents a buffered version of the input signal Vin to resistor R2 and transconductors TC1 and TC2. If the buffer A1 is not used, the input signal Vin will be presented directly to resistor R2 and transconductors TC1 and TC2. As will be understood from the discussion of FIG. 1C below, in an accordance with an embodiment of the present invention, each transconductor can be implemented using an RC circuit and a current mirror. Further, transconductors TC1 and TC2 may be referred to hereafter collectively, or individually, as a transconductance circuit.

When the switches SW1 and SW2 are in the selected positions (to the supply and ground positions, respectively, as shown in FIG. 1A), the buffered version of the input signal Vin simply passes through resistor R2 substantially unmodified and is presented at the output of the input stage 102 as Vout (capacitor C2 is used to pass the input signal Vin around resistor R2 at high frequencies). Thus, if the desire is to pass the input signal Vin through the input stage 102, the switches SW1 and SW2 should be connected as shown, such that the output currents of transconductors TC1 and TC2 are shunted away from resistor R2. The input stage 102 will be said to be "selected" when it produces a substantially unmodified voltage mode version of its input at its output, as just described.

To reject the input signal Vin, switches SW1 and SW2 are switched to the deselected positions (the positions opposite to those shown in FIG. 1A). When switches SW1 and SW2 are in the deselected position, a current sourced from transductor TC1 flows through resistor R2 and is sunk into the output of transconductor TC2. This transconductor current produces a voltage drop, which is opposite in phase to Vin, across resistor R2, pulling the Vout node of input stage 102 to a known "deselect" voltage that is set by the current and gm (i.e., transconductance) of the transconductors TC1 and TC2. This "deselect" voltage can be any value, but is nominally equal to the lowest voltage value of the multiplexer's intended common mode range. This "deselect" voltage is set by selecting the gm of each transconductor. This is done in practice by changing the current available (nominally, the current and gm of TC1 and TC2 are equal) from each transconductor. Since the transconductors are driven by the input signal Vin of the input stage, their resultant output currents track the input voltage, producing a rejection voltage which is equal, but opposite in phase, to the input voltage, Vin, thus cancelling the effects of Vin at the Vout node. The input stage 102 will be said to be "deselected" when it rejects its input signal, as just described.

FIG. 1B is a circuit diagram of an input stage 102', according to another embodiment of the present invention. In this embodiment, the amplifier A1 acts as one of the transconductors, and thus, is labeled A1/TC1 (eliminating the need for the separate transconductor TC1 shown in FIG. 1A). While the buffer/transconductor1 A1/TC1 can be used to unload the input signal source, it is not strictly necessary, and thus need not be included. If buffer/transconductor1 (A1/TC1) is not physically included, then the input signal source (not shown) will function as the transconductor1 (TC1). As will be discussed below with reference to FIG. 1C, the transconductor2 (TC2) can be implemented using an RC circuit and a current mirror.

FIG. 1C shows an input stage 102" including an input buffer/transconductor1 (A1/TC1), resistors R1 and R2, capacitors C1 and C2, a current mirror/transconductor2 (CM/TC2) and a switch SW1. While the buffer/transconductor1 (A1/TC1) can be used to unload the input signal source, it is not strictly necessary, and thus need not be included. If buffer/transconductor1 (A1/TC1) is not physically included, the input signal source (not shown) then functions as the first transconductor1 (TC1). If the buffer/transconductor 1 (A1/TC1) is used, an input signal Vin that is presented at an input to the buffer/transconductor1 (A1/TC1) is passed through the buffer/transconductor1 (A1/TC1), which presents a buffered version of the input signal Vin to resistor R1 and resistor R2. If the buffer/transconductor1 (A1/TC1) is not used, the input signal Vin will be presented directly to resistors R1 and R2.

When the switch SW1 is in the selected position (the left position shown in FIG. 1C), the buffered version of the input signal Vin simply passes through resistor R2 substantially unmodified and is presented at the output of the input stage 102 as Vout (capacitor C2 is used to pass the input signal Vin around resistor R2 at high frequencies). Thus, if the desire is to pass the input signal Vin through the input stage 102, the switch SW1 should be connected as shown, such that the output current of the current mirror/transconductor2 (CM/TC2) is not passed to the output side of resistor R2. The input stage 102 will be said to be "selected" when it produces a substantially unmodified voltage mode version of its input at its output, as just described.

To reject the input signal Vin, the switch S1 is switched to the deselected position (the right position shown in FIG. 1A). When the switch SW1 is in the deselected position, the signal source (or, if included, the buffer/transconductor1 (A1/TC1)), the resistor R1, and the input of CM act as a transconductor, converting Vin to a control current. This control current, which is presented to the input of the current mirror/transconductor2 (CM/TC2), is a function of the capacity of the input signal source (or, if included, buffer/transconductor1 (A1/TC1)), the voltage drop across resistor R1, the value of resistor R1, and the input drop of the CM/TC2 input. If transconductor/current mirror CM/TC2 is a simple current mirror, and is designed such that its output current is substantially equal to its input control current, then current sourced from the input signal source (or, if included, buffer/transconductor1 (A1/TC1)) flows through resistor R2 and is sunk by the output of the transconductor/current mirror output (CM/TC2). The input signal source (or if included, buffer/transconductor1 (A1/TC1)), in this case, should have the capacity to provide at least twice the current sunk by the output of transconductor/current mirror CM/TC2. Assuming A1/TC1 capacity and also if R1=R2, then the current (I) flowing from R2 at the Vout node, will cause a voltage drop across R2 in direct proportion, but opposite in phase, to that of the driving input signal, Vin, thus creating a constant voltage substantially equal to V1 at the Vout node, canceling the Vin signal. The input stage 102 will be said to be "deselected" when it rejects its input signal, as just described.

Figure 2:
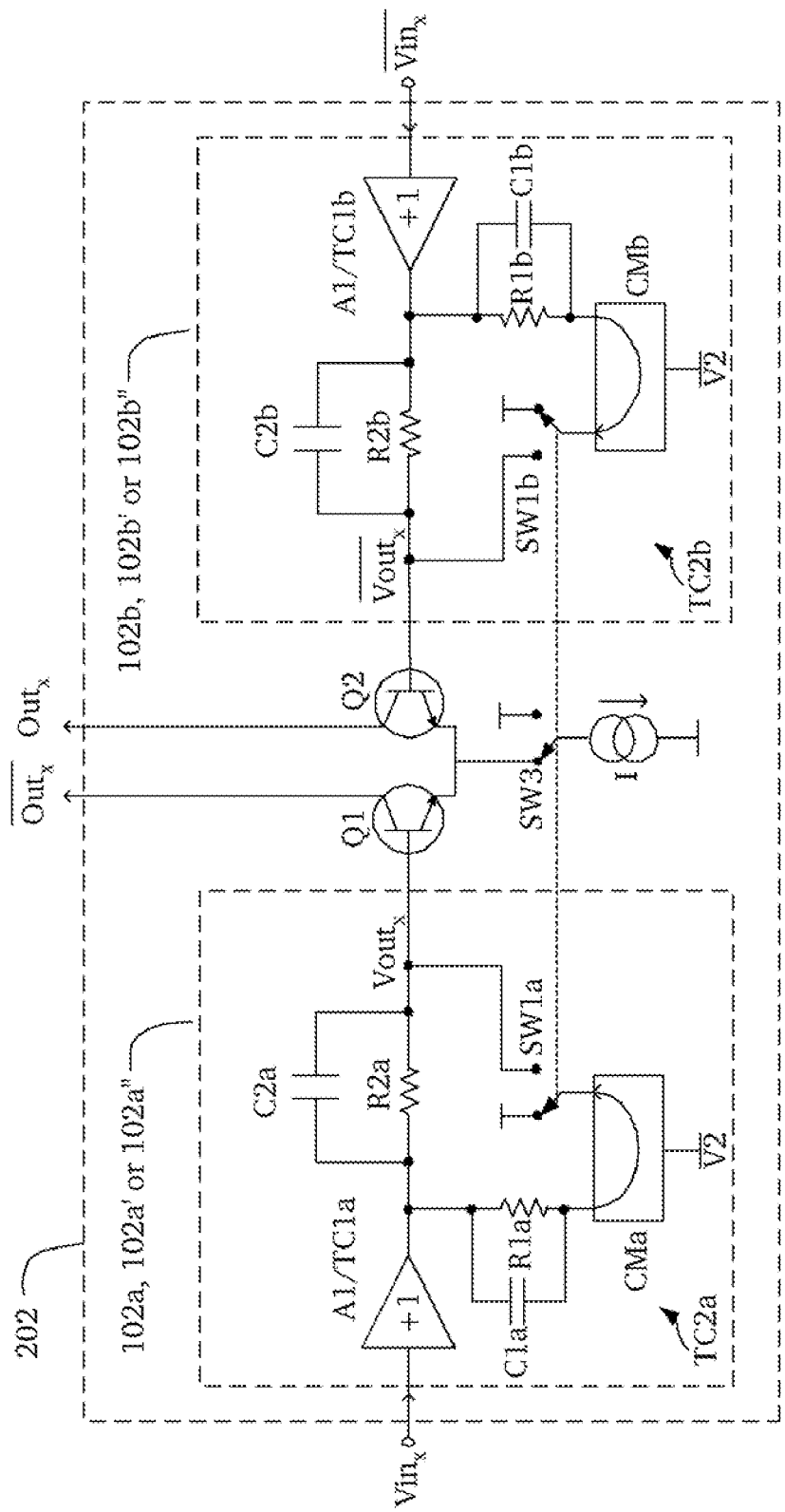
FIG. 2 is a circuit diagram of a switched differential amplifier, according to an embodiment of the present invention.

FIG. 2 is a circuit diagram of a switched differential amplifier 202 according to an embodiment of the present invention. As shown, the switched differential amplifier 202 includes a pair of switched input stages 102a" and 102b" from FIG. 1C (or alternatively 102a and 102b from FIG. 1A, or 102a' and 102b' from FIG. 1B). Additionally, the switched differential amplifier includes a differential pair of transistors Q1 and Q2, a switch SW3 and a current source I. The outputs of the switched input stages are provided to the bases of transistors Q1 and Q2, respectively. The switch S3 selectively connects the emitters of transistors Q1 and Q2 to the current source I. The collectors of transistors Q1 and Q2 form the outputs (Out$_x$ and Out$_x$_bar) of the switched differential amplifier 202.

When the switched differential amplifier 202 is "selected," both input stages 102a and 102b are "selected," and the switch SW3 is switched such that the emitters of transistors Q1 and Q2 are connected to the current source I, as shown in FIG. 2. This will cause the input signals (Vin$_x$ and Vin$_x$_bar) to pass in voltage mode, substantially unmodified through the switched input stages 102a" and 102b", causing the output signals (Out$_x$ and Out$_x$_bar) to be current mode equivalents of the inputs signals (Vin$_x$ and Vin$_x$_bar). With the emitters of transistors Q1 and Q2 connected to the current source I, the transistors Q1 and Q2 are turned on, and the differential pair of transistors Q1 and Q2 act as a normal differential amplifier with the output (Out$_x$ and Out$_x$_bar) of the differential amplifier being presented at the collectors of the transistors.

When the switched differential amplifier 202 is "deselected," both switched input stages 102a" and 102b" are "deselected" and held at a substantially constant, substantially equal, and below common mode voltage (in accordance with the explanation of FIGS. 1A-1C), and the switch S3 is switched such that the emitters of transistors Q1 and Q2 are not connected to the current source I, input signals (Vin$_x$ and Vin$_x$_bar) will be rejected, causing the output signals (Out$_x$ and Out$_x$_bar) to be substantially reduced. With the emitters of transistors Q1 and Q2 not connected to the current source 1, the transistors Q1 and Q2 are turned off. This results in further input signal rejection with substantially zero level current outputs (Out$_x$ and Out$_x$_bar) at the collectors of the transistors Q1 and Q2. In this manner, substantially none of the input signals (Vin$_x$ and Vin$_x$_bar)

will propagate to the outputs ($Out_x$ and $Out_x$_bar) of the switched differential amplifier 202, when the amplifier 202 is "deselected". Thus, when "deselected," the switched input stages and the differential amplifier provide for double isolation of the input signal.

Figure 3:
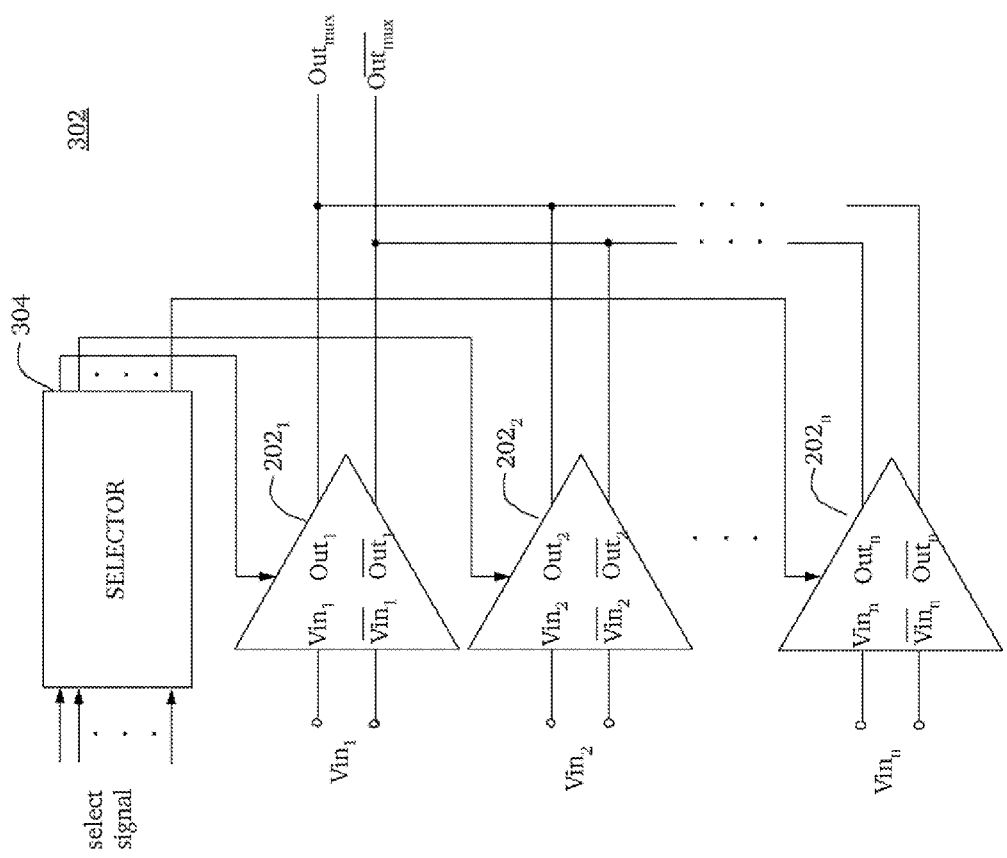
FIG. 3 is a circuit diagram of a multiplexer, according to an embodiment of the present invention.

FIG. 3 shows multiple switched differential amplifiers 202 of FIG. 2 connected as a multiplexer 302. A selector 304 (e.g., a multi-bit decoder) accepts a select signal (e.g., binary data) and turns on exactly one of its outputs based on the select signal. For a more specific example, the selector 304 can have m binary inputs, useful for selecting 1 of $2^m$ outputs. In this manner, the selector 304 is used to "select" one of the switched differential amplifiers $202_1$-$202_n$ (where $n \geq 2$). The selected differential amplifier 202 sets its internal switches to allow the selected analog input to propagate through the differential amplifier. The outputs of the selected switched differential amplifier 202 are connected together (e.g., wired together) with the corresponding outputs of the other switched differential amplifiers, which are each "deselected". As explained in detail above, the outputs of the "deselected" switched differential amplifier(s) 202 will be substantially equal to zero, and thus, generally not affect the outputs of the multiplexer 302 ($Out_{mux}$ and $Out_{mux}$_bar).

Figure 4:
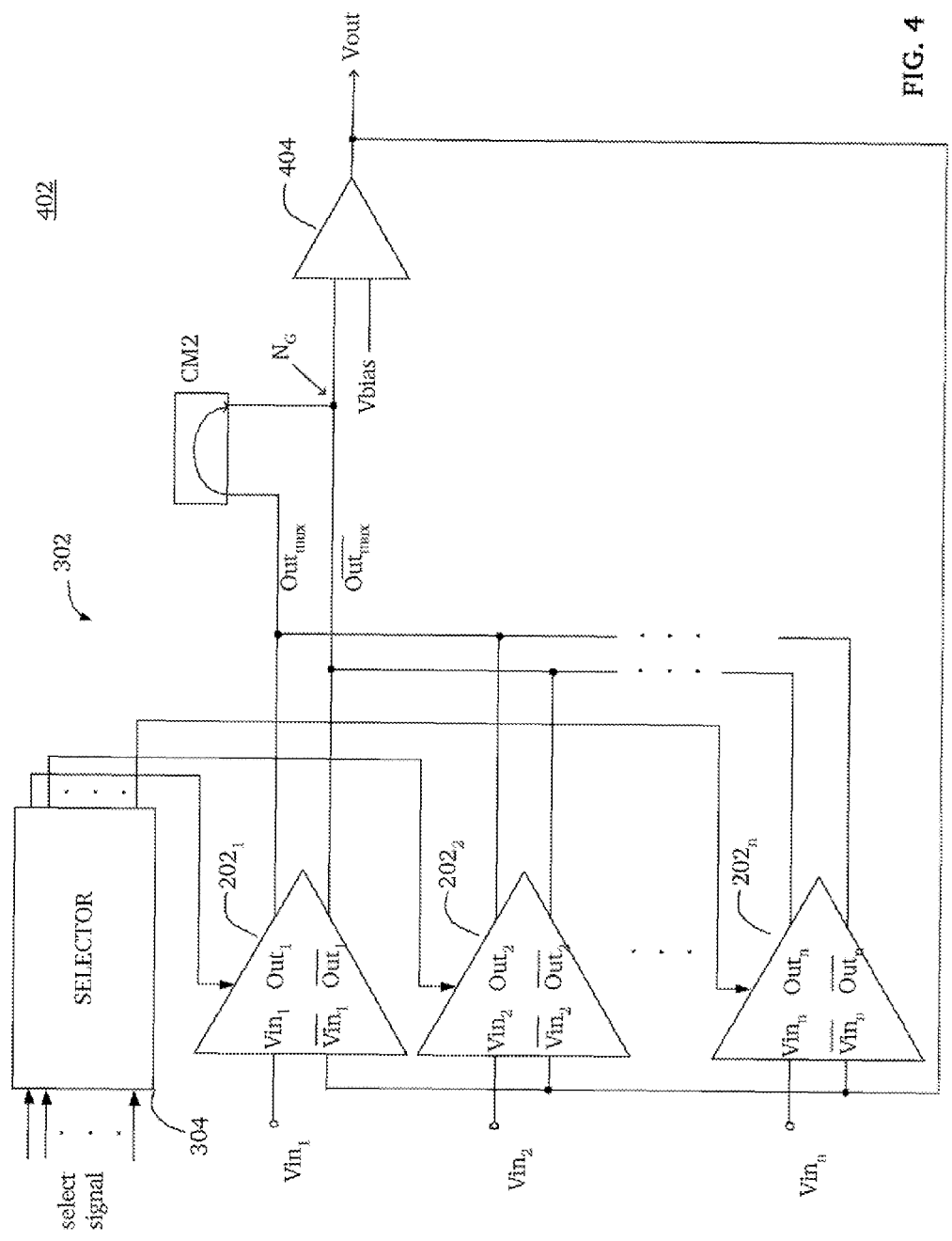
FIG. 4 is a circuit diagram of a multiplexing amplifier, according to an embodiment of the present invention.

FIG. 4 shows a multiplexing amplifier 402, according to an embodiment of the present invention. As can be appreciated from FIG. 4, the multiplexing amplifier 402 builds upon the circuits discussed above. More specifically, the multiplexing amplifier 402 is shown as including the multiplexer 302 of FIG. 3, a current mirror CM2, and an output amplifier 404. The current mirror CM2 is used to combine the two current mode output signals of the multiplexer 302 at a gain node $N_G$ to produce a single-ended voltage signal, which is passed through the output amplifier 404. The output of the amplifier 404 is fed back as shown, providing for an operational feedback circuit. The difference in the currents at $Out_{mux}$ and $Out_{mux}$_bar causes the voltage at the gain node $N_G$ to move around. The voltage at the gain node $N_G$ is fed back to the input of the selected switched differential amplifier 202, such that a final value of output voltage (Vout) of the multiplexing amplifier is reached.

The output amplifier 402 can be a gain amplifier or a simple buffer. In another embodiment, the output amplifier 402 is removed and replaced with a wire, causing the output voltage (Vout) to be the voltage at the gain node $N_G$.

One of ordinary skill in the art would appreciate that the above circuits could essentially be flipped by replacing the NPN transistors with PNP transistors, and appropriately adjusting the supply voltage. One of ordinary skill in the art will also appreciate that other types of transistors, such as, but not limited to complimentary-metal-oxide-semiconductor (CMOS) type transistors (i.e., NMOS and PMOS) or junction field effect transistors (JFETs), can alternatively be used. Additionally, one of ordinary skill in the art would understand that fully complimentary versions of the above described circuits are also within the spirit and scope of the present invention.

Multiplexers in accordance with embodiments of the present invention can be used, e.g., to provide video multiplexers. In one specific example, embodiments of the present invention can multiplex RGB signals received from several video sources (e.g., DVD players, VCRs, tuners, digital cameras, etc.) into a single video display (also known as a monitor).

For example, as shown in FIG. 5, embodiments of the present invention can be used to produce a triple 2:1 video multiplexer 502. Such a multiplexer 502 is useful for various types of applications, such as, but not limited to, set-top boxes, in-car navigation/entertainment, servers, security systems, video projectors, notebook computers, broadcast video and video crosspoint switching.

More specifically, the triple 2:1 video multiplexer 502 in FIG. 5 is made up of three 2:1 multiplexers 402a, 402b and 402c, which are each similar to the multiplexer 402 described above with reference to FIG. 4. A first video source 504a outputs a first RGB video signal, with the R portion of the signal being provided to the 2:1 mux 402a, the G portion of the signal being provided to the 2:1 mux 402b, and the B portion of the signal being provided to the 2:1 mux 402c. A second video source 504b outputs a second RBG video signal, with the R portion of the signal being provided to the 2:1 mux 402a, the G portion of the signal being provided to the 2:1 mux 402b, and the B portion of the signal being provided to the 2:1 mux 402c. Each 2:1 mux 402a, 402b, and 402c is substantially similar, and thus the details are only shown of the 2:1 mux 402a.

A source select signal is provided to the selector 304. Based on the source select signal, the selector 304 selects one of two switched differential amplifiers 202 (i.e., $202_1$ or $202_2$) within each 2:1 mux 402a, 402b and 402c. In this manner, the RGB signal from either the first video source 504a or the RGB signal from the second video source 504b (which may or may not be amplified) is output from the triple 2:1 mux 502 and provided to the display 506 (e.g., a television or other type of monitor).

This is just one example of how the embodiments of the present invention can be used. One of ordinary skill in the art will appreciate that there are numerous other related and unrelated uses for the multiplexer embodiments of the present invention.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A method for using an input stage for multiplexing, the input stage including an input terminal and an output terminal, the method comprising:

accepting a voltage input signal at the input terminal of the input stage;

presenting a substantially unmodified version of the voltage input signal at the output terminal of the input stage, when the input stage is selected; and producing a rejection voltage signal of substantially equal magnitude and opposite polarity to the voltage input signal in order to reject the voltage input signal and thereby present a substantially constant voltage at the output terminal of the input stage regardless of variations in the voltage input signal, when the input stage is deselected.

2. The method of claim 1, wherein the producing step includes using at least one transconductor to produce the rejection voltage signal.

3. The method of claim 2, wherein the producing step includes using a pair of transconductors to produce the rejection voltage signal.

4. The method of claim 1, wherein the producing step includes:
converting the voltage input signal to a proportional current signal; and
converting the proportional current signal to the rejection voltage signal.

5. The method of claim 1, wherein:
the input terminal of the input stage comprises an input terminal of a buffer; and
the accepting step comprises accepting the voltage input signal at the input terminal of the buffer.

6. The method of claim 5, wherein the presenting step includes using a passive resistance to pass a buffered version of the voltage input signal from an output terminal of the buffer to the output terminal of the input stage.

7. The method of claim 1, wherein the presenting step includes using a passive resistance to pass the voltage input signal, or a buffered version thereof, to the output terminal of the input stage.

8. The method of claim 1, wherein the input stage is used with at least one other input stage, and wherein only one of the input stages is selected at a time.

9. A method for using an input stage for multiplexing, the input stage including an input terminal and an output terminal, the method comprising:
accepting a voltage input signal at the input terminal of the input stage;
accepting a control signal that specifies whether the input stage is selected or deselected;
presenting a substantially unmodified version of the voltage input signal at the output terminal of the input stage, when the input stage is selected; and
producing a rejection voltage signal of substantially equal magnitude and opposite polarity to the corresponding voltage input signal in order to reject the voltage input signal and thereby present a substantially constant voltage at the output terminal of the input stage regardless of variations in the voltage input signal, when the input stage is deselected.

10. The method of claim 9, further comprising:
controlling at least one switch of the input stage based on the control signal, wherein the at least one switch has a selected position and a deselected position.

11. An input stage for multiplexing, the input stage comprising:
an input terminal to accept a voltage input signal;
an output terminal;
a means for presenting a substantially unmodified version of the voltage input signal at the output terminal of the input stage, when the input stage is selected; and
a means for producing a rejection voltage signal of substantially equal magnitude and opposite polarity to the corresponding voltage input signal in order to reject the voltage input signal and thereby present a substantially constant voltage at the output terminal of the input stage regardless of variations in the voltage input signal, when the input stage is deselected.

12. The input stage of claim 11, wherein the means for producing the rejection voltage signal includes at least one transconductor.

13. The input stage of claim 12, wherein the means for producing the rejection voltage signal includes a pair of transconductors.

14. The input stage of claim 11, wherein the means for producing the rejection voltage signal includes at least one transconductor that includes an RC circuit and a current mirror.

15. The input stage of claim 14, wherein the RC circuit includes a resistor and a capacitor connected in parallel.

16. The input stage of claim 11, wherein the means for producing the rejection voltage includes:
a means for converting the voltage input signal to a proportional current signal; and
a means for converting the proportional current signal to the rejection voltage signal.

17. The input stage of claim of claim 11, wherein the means for presenting the substantially unmodified version of the voltage input signal includes a passive resistance.

18. The input stage of claim of claim 17, wherein the means for presenting the substantially unmodified version of the voltage input signal includes a capacitor connected in parallel with the passive resistance.

19. The input stage of claim 11, further comprising a means for controlling whether the input stage is selected or deselected.

20. The input stage of claim 19, wherein the input stage is used with at least one other input stage, and wherein only one of the input stages is selected at a time.

21. An input stage for multiplexing, the input stage comprising:
an input terminal to accept a voltage input signal;
an output terminal;
a passive resistance and a capacitor, connected in parallel, to present a substantially unmodified version of the voltage input signal at the output terminal of the input stage, when the input stage is selected; and
at least one transconductor to produce a rejection voltage signal of substantially equal magnitude and opposite polarity to the corresponding voltage input signal in order to reject the voltage input signal and thereby present a substantially constant voltage at the output terminal of the input stage regardless of variations in the voltage input signal, when the input stage is deselected.

* * * * *